(12) United States Patent
Geuppert et al.

(10) Patent No.: US 7,826,155 B2
(45) Date of Patent: Nov. 2, 2010

(54) VIBRATION DAMPING FOR PHOTOLITHOGRAPHIC LENS MOUNT

(75) Inventors: Bernhard Geuppert, Aalen (DE); Leonhard Soell, Herbrechtingen (DE)

(73) Assignee: Carl Zeiss SMT AG, Oberkochen (DE)

( * ) Notice: Subject to any disclaimer, the term of this patent is extended or adjusted under 35 U.S.C. 154(b) by 264 days.

(21) Appl. No.: 11/815,048

(22) PCT Filed: Feb. 7, 2006

(86) PCT No.: PCT/EP2006/001046

§ 371 (c)(1),
(2), (4) Date: Apr. 3, 2008

(87) PCT Pub. No.: WO2006/084657

PCT Pub. Date: Aug. 17, 2006

(65) Prior Publication Data

US 2008/0285161 A1    Nov. 20, 2008

Related U.S. Application Data

(60) Provisional application No. 60/652,305, filed on Feb. 11, 2005.

(51) Int. Cl.
*G02B 7/02* (2006.01)

(52) U.S. Cl. .................................................. 359/819
(58) Field of Classification Search ................ 359/811, 359/813, 819, 822
See application file for complete search history.

(56) References Cited

U.S. PATENT DOCUMENTS

| | | | |
|---|---|---|---|
| 4,597,475 A | | 7/1986 | Lässig et al. |
| 4,679,775 A | | 7/1987 | Funaki et al. |
| 5,822,133 A | * | 10/1998 | Mizuno et al. ............ 359/696 |
| 6,129,185 A | | 10/2000 | Osterberg et al. |
| 6,191,898 B1 | | 2/2001 | Trunz et al. |
| 6,327,024 B1 | | 12/2001 | Hayashi et al. |
| 6,473,245 B1 | | 10/2002 | Spinali |
| 6,529,264 B1 | | 3/2003 | Ikeda |
| 6,700,715 B2 | | 3/2004 | Sorg et al. |
| 2002/0140916 A1 | | 10/2002 | Binnard et al. |

* cited by examiner

*Primary Examiner*—Joseph Martinez
(74) *Attorney, Agent, or Firm*—Fish & Richardson P.C.

(57) ABSTRACT

A connection between two components supported in a mutually vibrating fashion has at least one connection element connecting the two components, and a gap located between the two components in which a medium is located. The gap has a width small enough to largely prevent a displacement of the medium inside the gap during comparatively fast relative movements between the two components.

26 Claims, 4 Drawing Sheets

VIBRATION DAMPING FOR PHOTOLITHOGRAPHIC LENS MOUNT

CROSS-REFERENCE TO RELATED APPLICATIONS

This application is a National Phase application under 35 U.S.C. §371 filed from International Patent Application Serial No. PCT/EP2006/001046, filed on Feb. 7, 2006, which claims priority to U.S. Provisional Application Ser. No. 60/652,305, filed Feb. 11, 2005.

The invention relates to a connection between two components supported in a mutually vibrating fashion in an objective for microlithography, having at least one connection element connecting the two components. The invention also relates to a mount for an optical element, a projection objective having at least two subassemblies, a projection objective having at least one subassembly that is held in a frame, and a measuring machine having a machine frame and a measuring frame.

U.S. Pat. No. 6,191,898 discloses a projection objective that has an optical element supported in an inner ring. The inner ring is connected to an outer ring via a number of connection elements that comprise rotary joints, adjusting screws and leaf springs.

Because of the increasingly smaller structure sizes to be imaged in the case of such projection objectives, ever more stringent requirements are being placed on the reduction of the contrast loss of the objective, which is caused by the vibrations of the optical element. These requirements can be satisfied by reducing the amplitude of the vibrations of the optical elements. On the other hand, in the case of projection objectives for microlithography, use is being made of ever larger and therefore also ever heavier optical elements, the result being a drop in the natural frequency level. If a relatively broadband excitation is present, however, such a comparatively low natural frequency entails a comparatively large vibration amplitude. It thus becomes clear that problems that clash with one another need to be overcome when reducing the patterns to be imaged with the aid of such projection objectives.

In order to reduce the vibration amplitude of a component holding the optical element, it is possible to use stiffer resilient elements and/or actuating elements to increase the stiffness of the connection between two components, that is to say the connection between the inner ring and the outer ring in the case of the above described mount of a projection objective. However, a greater stiffness of the resilient elements leads to larger forces that are required to adjust the manipulators provided between the inner ring and outer ring. This results in larger deformations of the optical element, and this in turn is deleterious for the imaging quality of the latter. Moreover, the actuating forces and the stresses inside the adjusting devices are increased, and this is accompanied by further not inconsiderable problems in the design of such mounts. A greater stiffness of the resilient elements leads in the case of deformation-decoupled mounts to a reduction in the deformation-decoupling action, and this counteracts the aim of these mounts.

A further possibility for reducing the vibration amplitude consists in increasing the damping. However, because the vibration amplitudes occur only in the nanometer range, a passive damping such as can be achieved, for example, by means of viscous elastic damping, oil damping or rubber dampers is not effective, because it does not extract enough energy from the vibration system. However, an active damping such as is described, for example, in U.S. Pat. No. 6,700,715 B2, entails, however, relatively high outlay, since very high requirements are placed on the sensors, actuators and the necessary control used in this case. In practice, it has emerged that it is relatively difficult to set the control so an to prevent an instability. Moreover, such an active damping necessitates a relatively high outlay on the cabling, the power supply and, finally, also on the space required for the entire system.

On the other hand, projection objectives, or else measuring machines in part comprise a number of subassemblies that have to be aligned with one another before commissioning. During operation, these subassemblies can vibrate relative to one another, but this is not desired, because it worsens the imaging quality in the case of projection objectives, and worsens the quality of the measurement in the case of measuring machines.

In the case of the projection objective described in U.S. Pat. No. 6,529,264 B1, the relative vibration amplitude of the two subassemblies is reduced by a stiff connection between these subassemblies. Provided for this purpose, for example, is a strut that rigidly interconnects the subassemblies. A similar projection objective is also described by U.S. Pat. No. 6,473,245 B1. In order to achieve the desired high level of stiffness, the subassemblies must be screwed to one another at a number of points, and to a supporting frame that may be present. This necessarily gives rise to a statically overdetermined fixing of the subassemblies to one another, as a result of which unavoidable manufacturing tolerances inside the connection elements and likewise unavoidable mounting tolerances when fastening said connection elements on the respective subassemblies cause strains and deformations at the interconnected subassemblies. However, these strains and deformations worsen the quality of the imaging and the reproducibility of the latter in the course of repeated mounting and demounting during the adjustment process.

U.S. Pat. No. 4,597,475 describes a universally moveable suspension part for a gyroscopesystem in which a double bellows filled with an oil is provided between a rotary disk and the gyroscopesystem, the aim of this being to achieve damping. However, the vibration amplitudes occurring in the case of projection lithography or of measuring machines are much too small to be able to be damped for the purpose of dissipating energy in the way described in this document.

It is therefore an object of the present invention to provide a connection between two components that is capable of balancing tolerances between the two components and of reducing vibrations occurring between the two components.

It is also an object of the invention to provide suitable connections of the respective two components to be interconnected for a mount for an optical element having an inner ring and an outer ring, for a projection objective having at least two subassemblies, and for a measuring machine having a machine frame and a measuring frame.

According to the invention, the first object is achieved by means of a connection between two components supported in a mutually vibrating fashion in an objective for microlithography, having at least one connection element connecting the two components, and having a gap located between the two components in which a medium is located, wherein the gap has a width small enough to largely prevent a displacement of the medium inside the gap during comparatively fast relative movements between the two components.

The first object is further achieved by means of a connection between two components supported in a mutually vibrating fashion in an objective for microlithography, having a connection element that connects the two components and is rigidly connected to one of the components, wherein there is located between the upper component and the connection element a gap in which a medium is located, and wherein the gap has a width small enough to largely prevent a displacement of the medium inside the gap during comparatively fast relative movements between the two components.

The invention is based on the finding that given small amplitudes of vibration between the two components, in particular amplitudes in the nanometer range, and given high vibration frequencies, the medium has no appreciable damping effect, since the molecules of the medium are not displaced with reference to one another. Thus, instead of a damping effect, the medium rather has an elastic effect. In other words, after a specific vibration frequency between the two components has been exceeded, the medium has no time to be displaced in the gap and continue flowing, but is elastically compressed or dilated and thereby prevents the movement between the two components by acting as a spring, as it were. The result is a flow resistance and a very high compressive stiffness of the medium, and this leads to an increase in the stiffness of the connection between the two components given vibrations of low amplitude and high frequency. As a result, in the relevant operating states the natural frequency of the two components is increased, and the amplitude of the vibration between the two components is reduced.

However, by contrast with an increase in the stiffness of the connection element connecting the two components through a permanent connection, the medium located in the gap enables a slow or low frequency movement between the two components when their amplitude is substantially greater than in the case of the high frequency vibrations previously addressed. In other words, in the case of low frequency movements the medium has sufficient time to be displaced from the gap or inside the gap, and does not stiffen the connection. The two components are thereby supported without strain relative to one another after a certain time.

Thus, in summary, together with the narrow gap in which it is located the medium used according to the invention does not exhibit a linear characteristic, since the connection is stiff given small, fast movements, and very soft given large, slow movements.

However, not only does the elastic connection according to the invention enable only slow movements between the two components, but it is thereby also rendered possible to balance tolerances between the connection element and the component not rigidly connected to the connection element, such that no stresses of any sort are introduced into the connection between the two components. Owing to the fact that the solution according to the invention permits the abolition of an additional rigid connection between the two components, there is advantageously no static overdetermination of the latter.

It is thereby necessary for the gap between the two components or between the connection element and one component to be very narrow such that the medium can form only a very thin film in the gap. It is thereby ensured that the medium cannot escape from the gap at high frequencies, and is therefore compressed. Otherwise, as is the case with relatively low frequencies, the medium is only moved as well, and it has only the damping effect.

Preferably, a viscous medium is used, most preferably a liquid having a high viscosity.

A further possibility is to use a liquid having a low viscosity as the medium. In this case, the gap comprises a flow restricting element.

The viscosity of the medium contributes to its resistance against compression, since the possibility of escaping from the gap is likewise reduced given an increase in the viscosity. In this context, the "width of the gap" signifies the least distance between the two components. The stiffness of the connection after a specific vibration frequency has been exceeded is therefore a function not only of the width of the gap, but also of the viscosity of the medium, a higher viscosity increasing the stiffness. The term "largely" with reference to the displacement of the viscous medium was selected because a slight displacement of said medium cannot be prevented under some circumstances. However, this displacement is always in a range that is negligible for the mode of operation described.

However, as an alternative to a liquid, it is also possible to use a gas as the medium. In this case, the gap comprises a flow restricting element to provide the necessary flow resistance.

An application of the connection according to the invention that is to be preferred results when the first component is an inner ring, and the second component is an outer ring of a mount for holding an optical element.

It can be provided in one design of the invention that the liquid is an oil. This has proved to be particularly advantageous with reference to the properties of the viscous medium that are explained in more detail above.

With regard to the second object specified above, one solution consists in a mount for an optical element, having an inner ring holding the optical element, and an outer ring connected to the inner ring by means of at least one connection element, wherein located between the inner ring and the outer ring is a gap in which a medium is located, and wherein the gap has a width small enough to largely prevent a displacement of the medium inside the gap during comparatively fast relative movements between the two components.

A further solution for these two objects results from a projection objective having at least two housings in which at least one optical element is arranged and which are interconnected in at least one connection element that is rigidly connected to one of the housings, wherein there is located between the other housing and the connection element a gap in which a medium is located, and wherein the gap has a width small enough to largely prevent a displacement of the medium inside the gap during comparatively fast relative movements between the two components.

A further solution to this second object results from a projection objective having at least one subassembly in which at least one optical element is arranged and which is held in a frame, wherein located between the subassembly and the frame is a gap in which a medium is located, and wherein the gap has a width small enough to largely prevent a displacement of the medium inside the gap during comparatively fast relative movements between the two components.

A further solution to this second object consists in a measuring machine having a machine frame and a measuring frame connected to the machine frame by means of at least one connection element, wherein the connection element is rigidly connected to the machine frame or the measuring frame, wherein there is located between the connection element and the measuring frame or the machine frame a gap in which a medium is located, and wherein the gap has a width small enough to largely prevent a displacement of the medium inside the gap during comparatively fast relative movements between the two components.

Exemplary embodiments of the invention are illustrated in principle below with the aid of the drawings.

Figure 1:
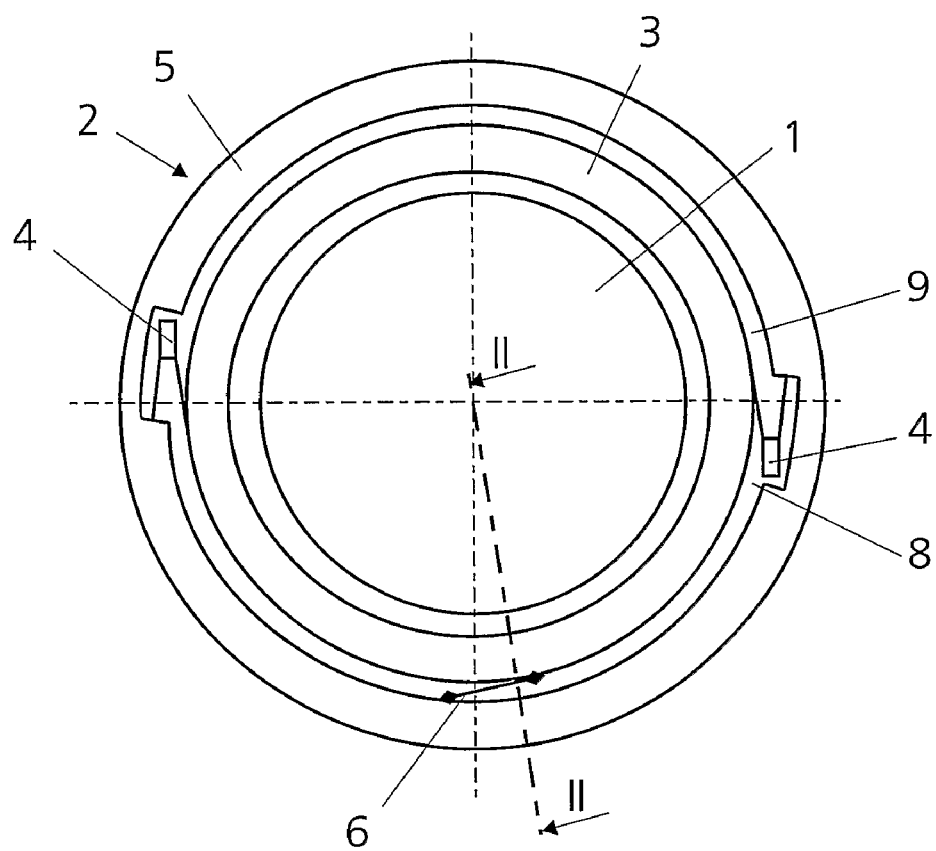
FIG. 1 shows a mount for an optical element having an inner ring and an outer ring that are interconnected by means of a connection according to the invention.
Figure 2:
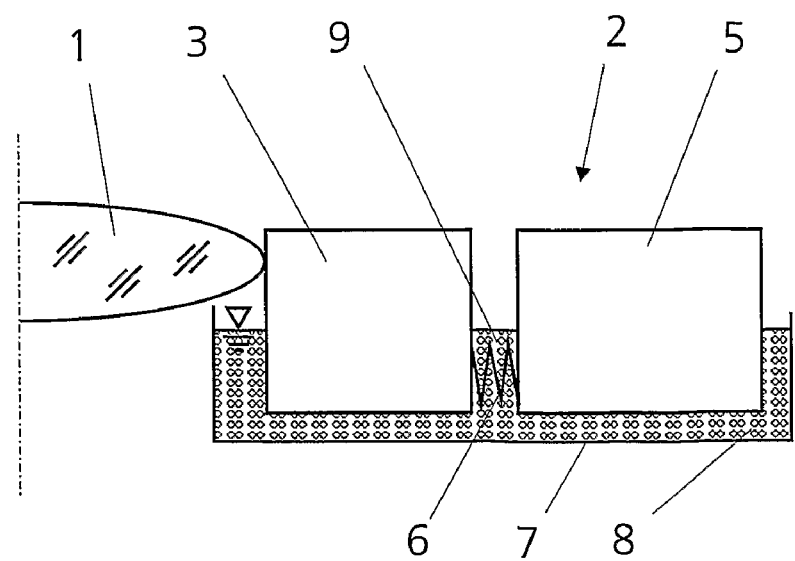
FIG. 2 shows a section according to the line II-II from FIG. 1.

FIGS. 1 and 2 show an optical element 1 that is designed as a lens in this case and is held in a mount 2. The mount 2 has two mount components, specifically an inner ring 3, on which the optical element 1 is fitted, and an outer ring 5 which is connected to the inner ring 3 via an actuating element 4. The actuating element 4, which, for example, can be of the type described in detail in U.S. Pat. No. 6,191,898 B1, and can also be denoted as a manipulator, can be use to move the inner ring 3 within certain limits such that the position of the optical element 1 can be varied. Moreover, the inner ring 3 is connected to the outer ring 5 via a resilient element 6 whose function is likewise described in detail in U.S. Pat. No. 6,191,898 B1, the disclosure content of which is hereby fully rendered the subject matter of the present application. The actuating element 4 and the resilient element 6 therefore constitute connection elements between the inner ring 3 and the outer ring 5. Instead of being designed as a lense, the optical element 1 could also be designed as a mirror.

Illustrated in FIG. 2 in addition to the mount 2, which has the inner ring 3 and the outer ring 5 between which the actuating element 4 (not illustrated in FIG. 2) and the resilient element 6 are arranged, and which serves for holding the optical element 1, a container 7 is illustrated in which a medium 8, in the embodiment of FIG. 2 a liquid with a high viscosity, is located. The viscous liquid, for example an oil, is at a level inside the container 7 such that it is located up to a specific height inside a gap 9 between the inner ring 3 and the outer ring 5. When the aim is to adjust the inner ring 3 with reference to the outer ring 5 by means of the actuating element 4, there are relatively large amplitudes of the inner ring 3 as against the outer ring 5 in conjunction with low frequencies between these two components, and so the viscous medium 8 is displaced from the gap in the event of such an adjustment. As a result, the inner ring 3, and thus also the optical element 1, are not more strongly deformed than is the case when the viscous medium 8 is dispensed with.

In the case of oscillations of higher frequency and/or faster relative movements between the inner ring 3 and the outer ring 5, such as can be transmitted from outside by arbitrary excitations, a stiffness of the connection between the inner ring 3 and the outer ring 5 results from the fact that the gap 9 has a width small enough to largely prevent a displacement of the viscous medium 8 inside the gap 9 during comparatively fast relative movements between the inner ring 3 and the outer ring 5. This flow resistance of the medium 8 resulting from its high visocity leads to an additional stiffness between the inner ring 3 and the outer ring 5, and this increases the natural frequency and reduces the amplitude of the vibration between the inner ring 3 and the outer ring 5.

Thus, high vibration frequencies between the inner ring 3 and the outer ring 5 result in a very high stiffness of the connection between these two components, whereas with low frequencies the viscous medium 8 located in the gap 9 allows a movement between the two components without deformation of the inner ring 3 and thus of the optical element 1.

When the mount 2 is designed as a deformation-decoupled mount, the viscous medium 8 likewise does not prevent the quasi-static deformation of the outer ring 5 and the resilient element 6, but a high natural frequency of the mount 2 is ensured nevertheless for vibrations in the nanometer range.

Figure 3:
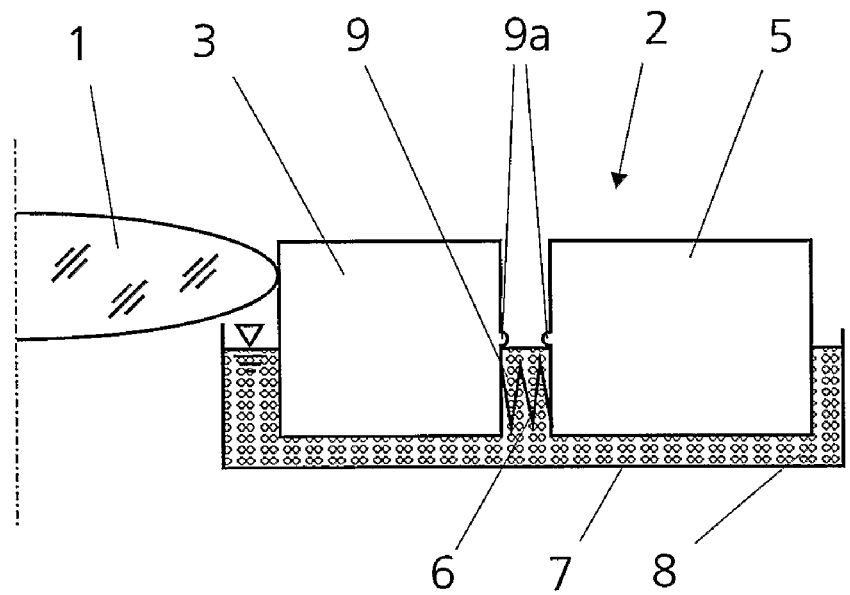
FIG. 3 shows an alternative embodiment to FIG. 2.

FIG. 3 shows an alternative embodiment to FIG. 2. In this embodiment, the medium 8 is also a liquid, however, with a low viscosity. To gain a similar flow resistance as obtained with the highly viscous liquid of the embodiment of FIG. 2, the gap 9 comprises a flow restricting element 9a, which, in the present case, is located in the upper part of gap 9 directly above medium 8, has a ring-shape and restricts the flow of medium 8. The cross-section of the opening of gap 9, through which medium 8 flows, can be adapted to the desired flow restriction of medium 8. Such a regulation of the flow resistance can also be achieved by a flow restricting element 9a, which can be adjusted or controlled by open or closed loop control during the use of mount 2. The viscosity of medium 8 can also be adapted to the the desired flow restriction. Furthermore, it is possible to apply flow restriction elements in the circumferential direction of gap 9.

Figure 4:
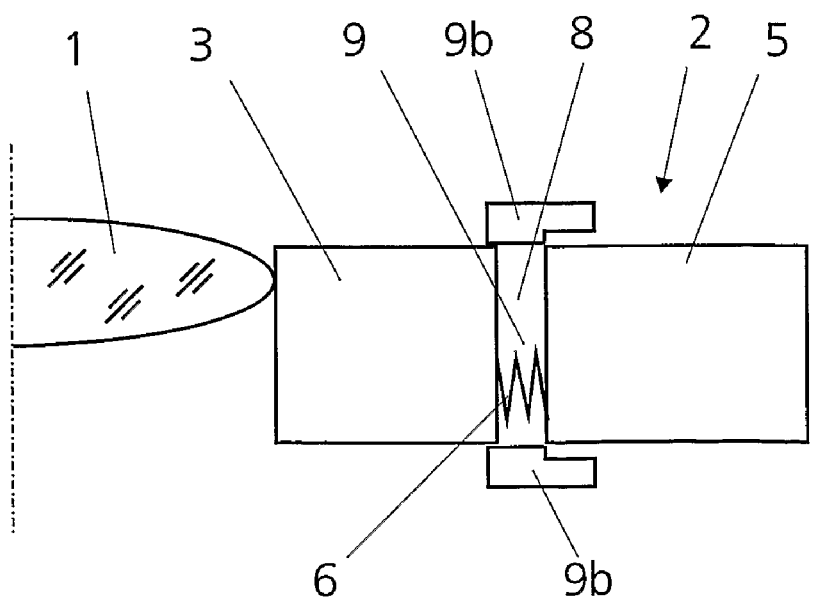
FIG. 4 shows a further alternative embodiment to FIG. 2.

FIG. 4 shows a further alternative embodiment to FIG. 2 and FIG. 3. In this embodiment, the medium 8 is a gas, for example air. Analogous to the embodiment of FIG. 3, to gain flow resistance as obtained with the highly viscous liquid of the embodiment of FIG. 2, the gap 9 comprises a flow restricting element 9b. The flow restricting element 9b is located above and below the gap 9 and reduces the cross-section of the opening of gap 9, through which medium 8 flows. Again, the cross-section of the opening of gap 9 can be adapted to the desired flow restriction of medium 8. In the present case, the opening of gap 9 is extremely narrow to achieve the above explained effect, namely that in the case of oscillations of higher frequency and/or faster relative movements between the inner ring 3 and the outer ring 5, a stiffness of the connection between the inner ring 3 and the outer ring 5 results from the fact that the opening of gap 9 has a width small enough to largely prevent a displacement of medium 8 inside gap 9 during comparatively fast relative movements between the inner ring 3 and the outer ring 5. The flow restricting elements 9a and 9b could also be designed to change the flow restriction they apply on medium 8.

Figure 5:
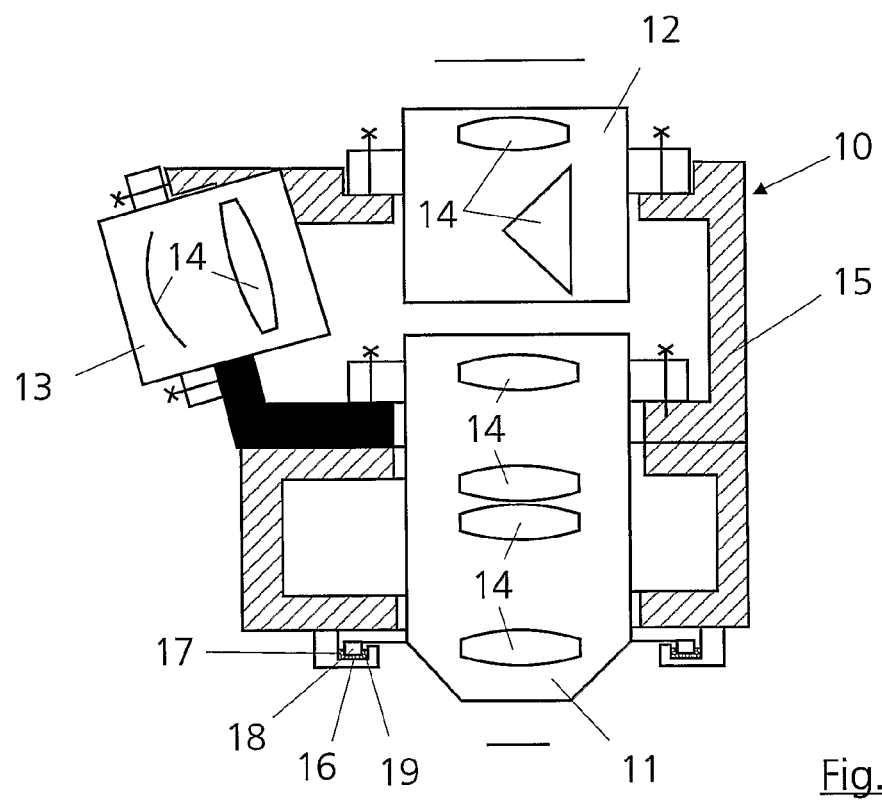
FIG. 5 shows a catadioptric projection objective having a number of subassemblies that are interconnected with the aid of a connection according to the invention.

Illustrated in FIG. 5 is a catadioptric projection objective 10 for producing semiconductor components or for use in microlithography, which in the present case has three subassemblies 11, 12 and 13 in which one or more optical elements 14 are arranged in each case. The optical elements 14 can be mirrors or lenses. The subassemblies 11, 12 and 13 are held in a frame 15 that is designed in the present case in a multipartite fashion. Of course, there could also be a unipartite frame 15, for example when the catadioptric projection objective 10 has fewer than three subassemblies 11, 12 and 13. It would also be possible in principle for the catadioptric projection objective 10 to have only one of the three subassemblies 11, 12 and 13.

A connection between the subassembly 13 and the frame 15 is illustrated by way of example for the lower subassembly 13 in the present case. Here, the frame 15 has a cutout 16 that is filled with a medium 17, or in which the medium 17 is located. The medium 17 can be identical to the above described medium 8, that is to say it can be an oil, for example. However, it can also be a liquid with a low viscosity or a gas as described above. Fitted on the subassembly 13 is a projection 18 that engages in the cutout 16 and forms therewith a gap 19 in which the medium 17 is located.

In the case of higher frequency vibrations or faster relative movements between the subassembly 13 and the frame 15, such as can be transmitted from outside by arbitrary excitations, a stiffness of the connection between the subassembly 13 and the frame 15 is provided by virtue of the fact that the gap 19 has a width small enough to largely prevent a displacement of the medium 17 inside the gap 19 during comparatively fast relative movements between the subassembly 13 and the frame 15. This leads to an additional stiffness between the subassembly 13 and the frame 15, and this reduces the amplitude of the vibration between the subassembly 13 and the frame 15.

In the case of high vibration frequencies between the subassembly 13 and the frame 15, the result is therefore a very high stiffness of the connection between these two components, whereas in the case of low frequencies the medium 17 located in the gap 19 permits a balancing of the mounting tolerances between the two components without deformations thereof.

Figure 6:
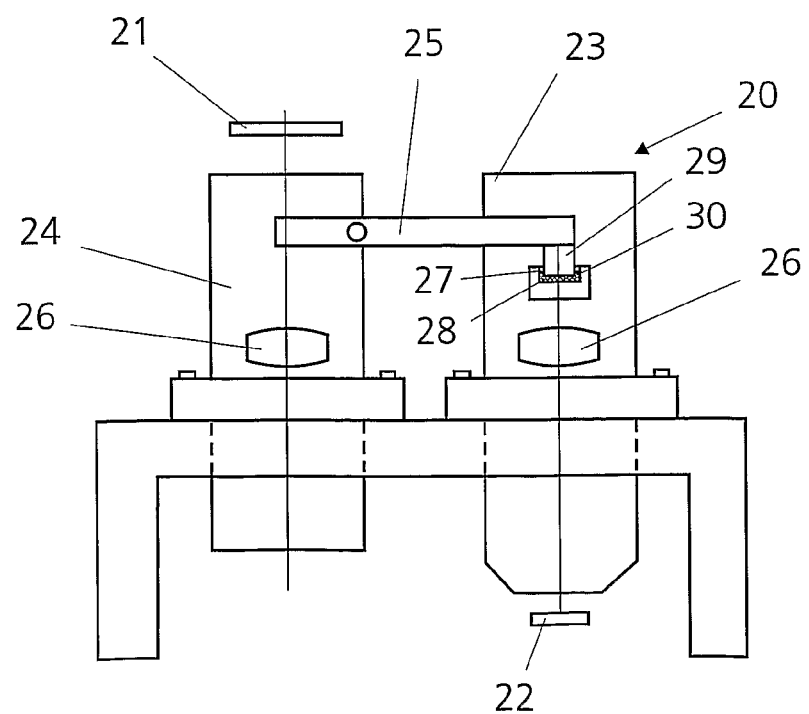
FIG. 6 shows a projection objective that has two subassemblies that each have at least one optical element and are interconnected by means of a connection according to the invention.

FIG. 6 shows a projection objective 20 that serves to produce semiconductor components. The projection objective 20 is used to image a reticle 21, in a way known per se and therefore not described in more detail, onto a wafer 22 located below the projection objective 20. The projection objective 20 has two housings 23 and 24 that are interconnected by means of a connection element 25. At least one optical element 26 is arranged in each of the housings 23 and 24.

The connection element 25 is rigidly connected to one housing 23. In a way similar to that described with reference to FIG. 5, the housing 24 has a cutout 27 in which a medium 28 is located. By contrast, there is fitted on the connection element 25 a projection 29 that forms with the cutout 27 a gap 30 in which the medium 28 is located. The medium 28 can be identical to the above described medium 8, that is to say it can be an oil, for example. However, it can also be a liquid with a low viscosity or a gas as described above. A connection as described with reference to FIG. 1, 2, 3 or 4 or FIG. 5 is thereby provided between the housing 24 and the connection element 25.

In the case of higher frequency vibrations or faster relative movements between the connection element 25 and the housing 24 or between the two housings 23 and 24 such as can be transmitted from outside by arbitrary excitations, a stiffness of the connection between the two housings 23 and 24 is provided by virtue of the fact that the gap 30 has a width small enough to largely prevent a displacement of the medium 28 inside the gap 30 during comparatively fast relative movements between the two housings 23 and 24. This leads to an additional stiffness between the two housings 23 and 24, something which increases the natural frequency, and thus reduces the amplitude of the vibration between the two housings 23 and 24.

Thus, in the case of high vibration frequencies between the two housings 23 and 24 the result is a very high stiffness of the connection between these two components, whereas in the case of low frequencies the medium 28 located in the gap 30 enables a balancing of the mounting tolerances between the two components without deformations thereof.

Figure 7:
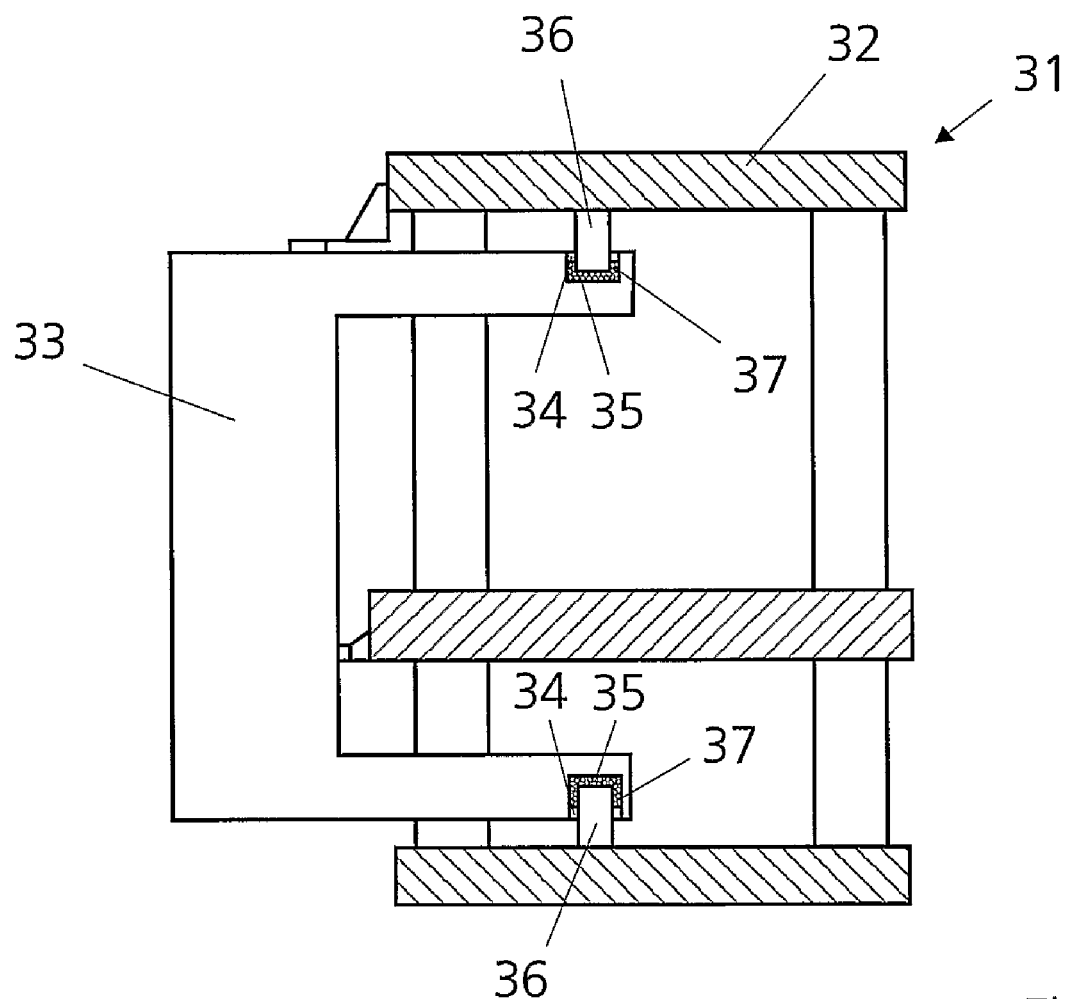
FIG. 7 shows a measuring machine and a machine frame and a measuring frame that are interconnected by means of a connection according to the invention.

FIG. 7 illustrates a measuring machine 31 that has a machine frame 32 and a measuring frame 33 connected to the machine frame 32. Here, the machine frame 32 consists, for example, of steel, and the measuring frame 33 consists of Zerodur. However, other suitable materials are also conceivable for these two components. In order to enable movements inside the machine frame 32 that do not lead to a deformation of the measuring frame 33, the machine frame 32 is provided here with a cutout 34 in which a medium 35 is located. Engaging in the cutout 34 is a projection 36 that is fitted on the measuring frame 33 and forms with the cutout 34 a gap 37 in which the medium 35 is located. The medium 35 can be identical to the above described medium 8, that is to say it can be an oil, for example. However, it can also be a liquid with a low viscosity or a gas as described above. If appropriate, the cutout 34 could also be assigned to the measuring frame 33, and the projection 36 could be assigned to the machine 32.

In the case of higher frequency vibrations or faster relative movements between the machine frame 32 and the measuring frame 33 such as can be transmitted from outside by arbitrary excitations, a stiffness of the connection between the machine frame 32 and the measuring frame 33 is provided by virtue of the fact that the gap 37 has a width small enough to largely prevent a displacement of the medium 35 inside the gap 37 during comparatively fast relative movements between the machine frame 32 and the measuring frame 33. This leads to an additional stiffness between the machine frame 32 and the measuring frame 33, something which increases the natural frequency, and thus reduces the amplitude of the vibration between the machine frame 32 and the measuring frame 33.

Thus, in the case of high vibration frequencies between the machine frame 32 and the measuring frame 33, the result is a very high stiffness of the connection between these two components, whereas in the case of low frequencies the medium 35 located in the gap 37 enables a movement between the two components without deformations thereof.

The invention claimed is:

1. A connection between first and second components supported in a mutually vibrating fashion in an objective for microlithography, having at least one connection element connecting the first and second components, and having a gap located between the first and second components in which a medium is located, wherein the first component is an inner ring, the second component is an outer ring of a mount for holding an optical element, and the inner ring and the outer ring are arranged in a container filled with the medium.

2. The connection as claimed in claim 1, wherein the medium is a viscous medium.

3. The connection as claimed in claim 1, wherein the medium is a liquid having a low viscosity, and wherein the gap comprises a flow restricting element.

4. The connection as claimed in claim 1, wherein the medium is a gas, and wherein the gap comprises a flow restricting element.

5. The connection as claimed in claim 1, wherein the at least one connection element is designed as a resilient element arranged between the inner ring and the outer ring.

6. The connection as claimed in claim 1, wherein the at least one connection element is designed as an actuating element between the inner ring and the outer ring.

7. The connection as claimed in claim 1, wherein the medium is a liquid having a high viscosity.

8. The connection as claimed in claim 3 or 7, wherein the liquid is an oil.

9. A connection between first and second components supported in a mutually vibrating fashion in an objective for microlithography, having a connection element that connects the first and second components and is rigidly connected to the first component, wherein there is located between the second component and the connection element a gap in which a medium is located, and wherein the first component is an inner ring, the second component is an outer ring of a mount for holding an optical element, and the inner ring and the outer ring are arranged in a container filled with the medium.

10. The connection as claimed in claim 9, wherein the medium is a viscous medium.

11. The connection as claimed in claim 9, wherein the medium is a liquid having a low viscosity, and wherein the gap comprises a flow restricting element.

12. The connection as claimed in claim 9, wherein the medium is a gas, and wherein the gap comprises a flow restricting element.

13. The connection as claimed in claim 9, wherein the first and second components are respectively subassemblies of a projection objective that have at least one optical element.

14. The connection as claimed in claim 9, wherein the connection element has a projection that engages in a cutout in the second component.

15. The connection as claimed in claim 9, wherein the medium is a liquid having a high viscosity.

16. The connection as claimed in claim 11 or 15, wherein the liquid is an oil.

17. A mount for an optical element, having an inner ring holding the optical element, and an outer ring connected to the inner ring via at least one connection element, wherein located between the inner ring and the outer ring is a gap in which a medium is located, and wherein the inner ring and the outer ring are arranged in a container filled with the medium.

18. The mount as claimed in claim 17, wherein the medium is a viscous medium.

19. The mount as claimed in claim 17, wherein the medium is a liquid having a low viscosity, and wherein the gap comprises a flow restricting element.

20. The mount as claimed in claim 17, wherein the medium is a gas, and wherein the gap comprises a flow restricting element.

21. A projection objective having at least one optical element and having at least one mount for the optical element as claimed in any of claims 17-20.

22. A measuring machine having a machine frame and a measuring frame connected to the machine frame via at least one connection element, wherein the connection element is rigidly connected to the machine frame or the measuring frame, wherein there is located between the connection element and the measuring frame or the machine frame a gap in which a medium is located, and wherein the at least one connection element is arranged in a container filled with the medium.

23. The measuring machine as claimed in claim 22, wherein the medium is a viscous medium.

24. The measuring machine as claimed in claim 22, wherein the medium is a liquid having a low viscosity, and wherein the gap comprises a flow restricting element.

25. The measuring machine as claimed in claim 22, wherein the medium is a gas, and wherein the gap comprises a flow restricting element.

26. The connection as claimed in claim 22, wherein the medium is a liquid having a high viscosity.

* * * * *

UNITED STATES PATENT AND TRADEMARK OFFICE
CERTIFICATE OF CORRECTION

PATENT NO. : 7,826,155 B2
APPLICATION NO. : 11/815048
DATED : November 2, 2010
INVENTOR(S) : Bernhard Geuppert and Leonhard Soell It is certified that error appears in the above-identified patent and that said Letters Patent is hereby corrected as shown below:

Column 2, line 4, delete "an" insert --as--.

Column 5, line 19, delete "Bl" insert --B1--.

Column 5, line 58, delete "visocity" insert --viscosity--.

Column 6, line 19, before "desired" delete "the".

Signed and Sealed this
Eighteenth Day of January, 2011

David J. Kappos
*Director of the United States Patent and Trademark Office*